United States Patent
Arnaud et al.

(10) Patent No.: US 11,362,084 B2
(45) Date of Patent: Jun. 14, 2022

(54) ESD PROTECTION

(71) Applicant: STMicroelectronics (Tours) SAS, Tours (FR)

(72) Inventors: Aurelie Arnaud, Saint-Cyr-sur-Loire (FR); Severine Lebrette, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 17/143,703

(22) Filed: Jan. 7, 2021

(65) Prior Publication Data

US 2021/0217746 A1 Jul. 15, 2021

(30) Foreign Application Priority Data

Jan. 9, 2020 (FR) ...................................... 2000159

(51) Int. Cl.
| | |
|---|---|
| *H01L 27/00* | (2006.01) |
| *H01L 27/02* | (2006.01) |
| *H01L 21/22* | (2006.01) |
| *H01L 29/66* | (2006.01) |
| *H01L 29/866* | (2006.01) |

(52) U.S. Cl.
CPC .......... *H01L 27/0255* (2013.01); *H01L 21/22* (2013.01); *H01L 29/66121* (2013.01); *H01L 29/866* (2013.01)

(58) Field of Classification Search
None
See application file for complete search history.

(56) References Cited

U.S. PATENT DOCUMENTS

2015/0137305 A1    5/2015   Schmenn et al.
2018/0301553 A1*  10/2018   Weyers ............... H01L 27/0255

OTHER PUBLICATIONS

Hamasaki et al., "Electronic Properties of Semi-Insulating Polycrystalline-Silicon (SIPOS) Doped with Oxygen Atoms," *Solid State Communications 21*, pp. 591-593, 1977.
Liss et al., "Charging properties of SIPOS used as a passivation layer on silicon," *Microelectronic Engineering 15*, pp. 125-128, 1991.
Matsushita et al., "Highly Reliable High-Voltage Transistors by Use of the SIPOS Process," *IEEE Transactions on Electron Devices*, pp. 826-830, Aug. 1976.
Mochizuki et al., "Semi-Insulating Polycrystalline-Silicon (SIPOS) Films Applied to MOS Integrated Circuits," Proceedings of the 7$^{th}$ Conference on Solid State Devices, Tokyo, 1975, Supplemental to Japanese Journal of Applied Physics, vol. 15, pp. 41-48, 1976.

* cited by examiner

*Primary Examiner* — Reema Patel
(74) *Attorney, Agent, or Firm* — Seed Intellectual Property Law Group LLP

(57) ABSTRACT

ESD protection devices and methods are provided. In at least one embodiment, a device includes a first stack that forms a Zener diode. The first stack includes a substrate of a first conductivity type having a first region of a second conductivity type located therein. The first area is flush with a surface of the substrate. A second stack forms a diode and is located on and in contact with the surface of the substrate. The second stack includes a first layer of the second conductivity type having a second region of the first conductivity type located therein. The second area is flush, opposite the first stack, with the surface of the first layer. A third stack includes at least a second layer made of an oxygen-doped material, on and in contact with the second stack.

20 Claims, 3 Drawing Sheets

ESD PROTECTION

BACKGROUND

Technical Field

The present disclosure generally concerns electronic devices and, more specifically, electronic electrostatic discharge protection devices.

Description of the Related Art

Different devices of prevention and protection against electrostatic discharges are known.

BRIEF SUMMARY

There is a need to improve the performance of current electronic electrostatic discharge protection devices.

An embodiment provides a device comprising:

a first stack, forming a Zener diode (known under trade name Transil), comprising a substrate of a first conductivity type having a first area of a second conductivity type located therein, the first area being flush with a surface of the substrate;

a second stack, forming a diode, located on top of and in contact with said surface of the substrate and comprising a first layer of the second conductivity type having a second area of the first conductivity type located therein, the second area being flush, opposite the first stack, with the surface of the first layer; and a third stack comprising at least a second layer made of semi-insulating polycrystalline silicon, on top of and in contact with the second stack.

According to an embodiment, the third stack comprises a third layer of a field oxide on top of and in contact with the second layer.

According to an embodiment, the third layer is made of undoped silicate glass.

According to an embodiment, the third layer is made of tetraethyl orthosilicate.

According to an embodiment, the third layer has a thickness in the range from 1 µm to 4 µm, preferably equal to approximately 2 µm, more preferably equal to 2 µm.

According to an embodiment, the second layer has a thickness in the range from 0.3 µm to 1 µm, preferably equal to approximately 0.8 µm, more preferably equal to 0.8 µm.

According to an embodiment, the first layer has a thickness in the range from 8 µm to 15 µm, preferably equal to approximately 12 µm, more preferably equal to 12 µm.

An embodiment provides a method of manufacturing the device, comprising at least the steps of:

forming the first area in the substrate;

forming the first layer by epitaxy, on top of and in contact with said surface of the substrate and the second area in the first layer; and forming the second layer on top of and in contact with the second stack.

According to an embodiment, the second layer is deposited by low pressure chemical vapor deposition.

According to an embodiment, the third layer is deposited by plasma-enhanced chemical vapor deposition.

According to an embodiment, the second layer and the third layer are simultaneously etched vertically in line with the second area.

BRIEF DESCRIPTION OF THE SEVERAL VIEWS OF THE DRAWINGS

The foregoing and other features and advantages will be discussed in detail in the following non-limiting description of specific embodiments in connection with the accompanying drawings.

DETAILED DESCRIPTION

Figure 1:
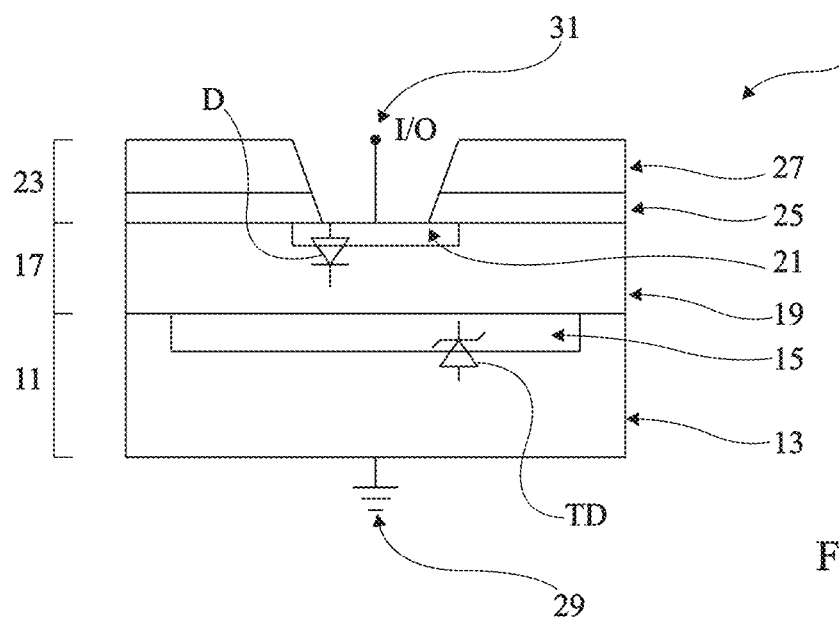
FIG. 1 is a partial simplified cross-section view of an electronic electrostatic discharge protection device.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, although an application to electrostatic discharge protection circuits is taken as an example, the described embodiments of an oxygen-doped layer limiting a charge transfer more generally apply to all the integrated circuits requiring or otherwise benefitting from such a barrier to charge transfers.

Throughout the present disclosure, the term "connected" is used to designate a direct electrical connection between circuit elements, whereas the term "coupled" is used to designate an electrical connection between circuit elements that may be direct, or may be via one or more other elements.

In the following description, when reference is made to terms qualifying absolute positions, such as terms "front," "back," "top," "bottom," "left," "right," etc., or relative positions, such as terms "above," "under," "upper," "lower," etc., or to terms qualifying directions, such as terms "horizontal," "vertical," etc., unless otherwise specified, it is referred to the orientation of the drawings.

The terms "about," "approximately," "substantially," and "in the order of" are used herein to designate a tolerance of plus or minus 10%, preferably of plus or minus 5%, of the value in question.

FIG. 1 is a partial simplified cross-section view of an embodiment of an electrostatic discharge protection device 1.

More particularly, FIG. 1 shows an electrostatic discharge protection circuit made in integrated form.

In the following description, the upper surface of the structure or the layer is considered, in the orientation of FIG. 1, as being the front side and the lower surface of the structure or the layer, in the orientation of FIG. 1, as being the back side.

Device 1 comprises:

a first stack 11 comprising a substrate 13 having a first area 15 flush with the upper surface of substrate 13 located therein;

a second stack 17, located on top of and in contact with the upper surface of the first stack 11, comprising a first layer 19 having a second area 21 flush with the upper surface of first layer 19 located therein; and a third stack 23, located on top of and in contact with the upper surface of the second stack 17, comprising at least one second layer 25.

Substrate 13 is made of a semiconductor material of a first conductivity type, for example, heavily doped. Substrate 13 is for example made of silicon.

First area 15 for example extends in the plane of the front side of the substrate over a surface area smaller than the surface of substrate 13. First area 15 is made of a material of a second conductivity type, different from the first conductivity type.

First layer 19 is made of a material of the first conductivity type, for example, very lightly doped. The material of first layer 19 has, for example, a conductivity in the range from 20 $\Omega \cdot cm^{-1}$ to 100 $\Omega \cdot cm^{-1}$.

Second area 21 is for example located opposite first area 15, extending, in the plane of the front side of the substrate, over a surface area smaller than the surface area of first area 15. Second area 21 is made of a material of the second conductivity type, for example, heavily doped.

Second layer 25 is open opposite a portion of second area 21. In other words, layer 25 exposes a portion of second area 21. Second layer 25 is made of a SIPOS (Semi-Insulating POlycrystalline Silicon) material. SIPOS corresponds to partially oxidized silicon, that is, silicon which generally has an oxygen concentration greater than approximately 10%. The oxygen concentration of the SIPOS in the present description is preferably in the range from 20% to 50% and is more preferably in the range from 25% to 35%.

The third stack 23 of device 1 illustrated in FIG. 1 further comprises a third layer 27 on top of and in contact with the front side of second layer 25. This layer 27 is a field oxide, for example, undoped silicate glass (USG) or tetraethyl orthosilicate (TEOS). Third layer 27 is open, opposite second layer 21, so that the opening of second layer 25 is aligned (horizontally in the orientation of FIG. 1) with the opening of third layer 27.

First stack 11 forms, by its junction between area 15 and substrate 13, a Zener diode, for example a diode known under trade name Transil, TD, having first area 15 as a cathode and substrate 13 as an anode.

Second stack 17 forms, by its junction between layer 19 and area 21, a diode D having first layer 19 as a cathode and second area 21 as an anode.

Device 1 is intended to be coupled to ground 29 by the back side of substrate 13 and comprises an input/output pad 31 (I/O) coupled, preferably connected, to second area 21.

An advantage of the present embodiment is the insulation provided by second layer 25 made of oxygen-doped silicon. Indeed, second layer 25 enables to limit the transmission of positive charges from third field-oxide layer 27 to first layer 19. The migration of charges between third layer 27 and layer 19 is decreased since the nature (semi-insulating) of second layer 25 enables to prevent charges accumulation at the interface with first layer 19.

Another advantage of the present embodiment is to be able to increase the thickness of third layer 27 and thus to decrease the general capacitance by decreasing metallization stray capacitances. Without layer 25, any increase of layer 27 to decrease stray capacitances would have as an unwanted effect a modification of the doping of underlying layer 19.

FIGS. 2 to 9 schematically and partially illustrate successive steps of an embodiment of a method of manufacturing the device 1 illustrated in FIG. 1.

To simplify the description, unless otherwise specified, a manufacturing step is designated in the same way as the structure obtained at the end of the step.

Figure 2:
FIG. 2 shows a step of an implementation mode of a method of manufacturing the device of FIG. 1.

FIG. 2 shows a step of an implementation mode of a method of manufacturing the device of FIG. 1.

More particularly, FIG. 2 shows an initial structure formed of substrate 13.

Figure 3:
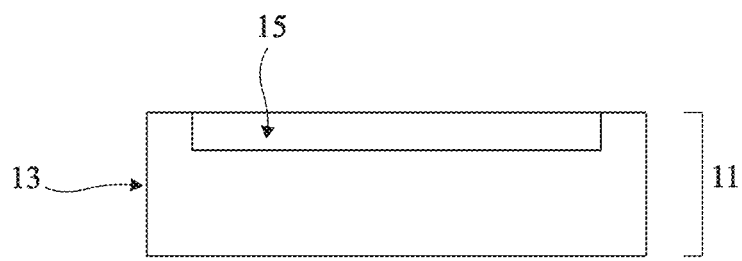
FIG. 3 shows another step of an implementation mode of a method of manufacturing the device of FIG. 1.

FIG. 3 shows another step of an implementation mode of a method of manufacturing the device of FIG. 1.

More particularly, FIG. 3 illustrates a step of forming first area 15 in substrate 13.

First area 15 is formed in substrate 13 so that its front side is flush with the front side of substrate 13. First area 15 for example extends in the plane of the front side of the substrate, over a surface area smaller than the surface area of substrate 13.

At the end of the step illustrated in FIG. 3, first area 15 is buried in substrate 13 and forms, with substrate 13, first stack 11.

Figure 4:
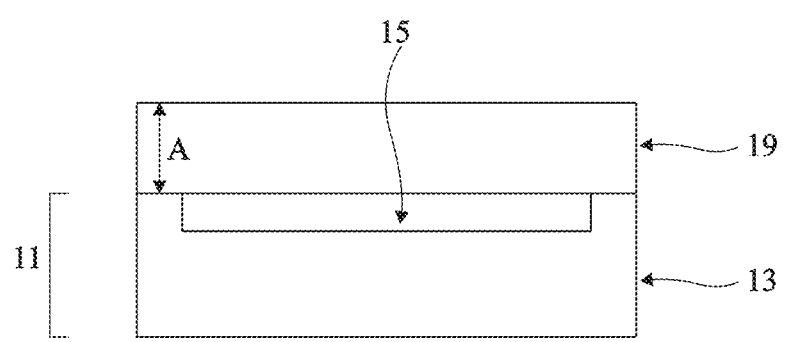
FIG. 4 shows another step of an implementation mode of a method of manufacturing the device of FIG. 1.

FIG. 4 shows another step of an implementation mode of a method of manufacturing the device of FIG. 1.

More particularly, FIG. 4 illustrates a step of forming first layer 19 on the front side of the structure obtained at the end of the steps of FIGS. 2 and 3.

Layer 19 is formed over the entire structure (full plate), that is, it is formed on the upper surface of substrate 13 and of first area 15. Layer 19 has a substantially constant thickness A across its entire surface.

Thickness A of first layer 19 is in the range from 8 µm to 15 µm, preferably equal to approximately 12 µm. Thickness A is more preferably equal to 12 µm.

First layer 19 is formed, for example, by epitaxy at the surface of first stack 11.

Figure 5:
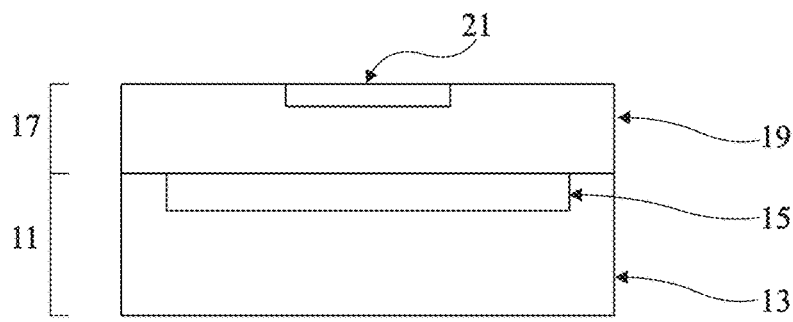
FIG. 5 shows another step of an implementation mode of a method of manufacturing the device of FIG. 1.

FIG. 5 shows another step of an implementation mode of a method of manufacturing the device of FIG. 1.

More particularly, FIG. 5 illustrates a step of forming second area 21 in the first layer 19 of the structure obtained at the end of the steps of FIGS. 2 to 4.

Second area 21 is formed in first layer 19 so that the front side of the second area 21 is flush with the front side of layer 19. Second area 21 is for example located opposite first area 15 and centered with respect thereto. Second area 21 extends, in the plane of the front side of substrate 13, over a surface area smaller than the surface area of first area 15.

At the end of the step illustrated in FIG. 5, second area 21 is buried in layer 19 and forms, with layer 19, second stack 17.

Figure 6:
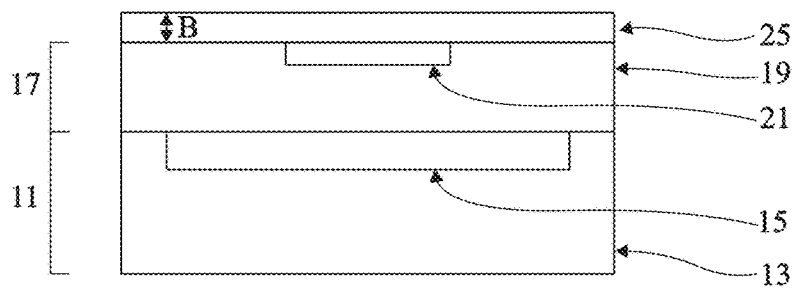
FIG. 6 shows another step of an implementation mode of a method of manufacturing the device of FIG. 1.

FIG. 6 shows another step of an implementation mode of a method of manufacturing the device of FIG. 1.

More particularly, FIG. 6 illustrates a step of depositing second layer 25 on the front side of the structure obtained at the end of the steps of FIGS. 2 to 5.

Layer 25 is deposited full plate over the entire structure, that is, it is deposited on the upper surface of first layer 19 and on the front side of second area 21. Layer 25 has a substantially constant thickness B across its entire surface.

Thickness B of second layer 25 is in the range from 0.3 µm to 1 µm, preferably equal to approximately 0.8 µm. Thickness B is more preferably equal to 0.8 µm.

Layer 25 is formed, for example, by low-pressure chemical vapor deposition (LPCVD).

Figure 7:
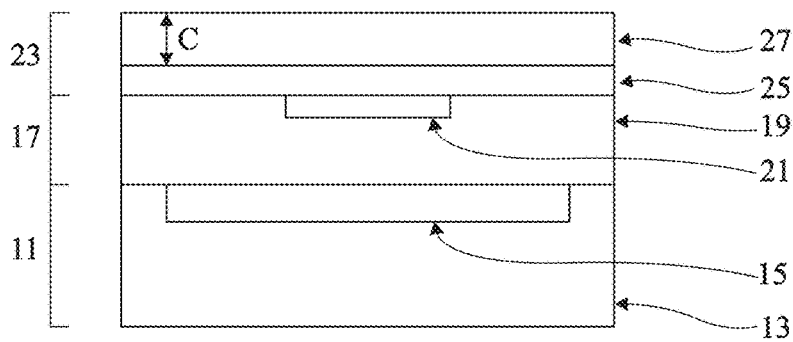
FIG. 7 shows another step of an implementation mode of a method of manufacturing the device of FIG. 1.

FIG. 7 shows another step of an implementation mode of a method of manufacturing the device of FIG. 1.

More particularly, FIG. 7 illustrates a step of depositing third layer 27 on the front side of the structure obtained at the end of the steps of FIGS. 2 to 6.

Layer 27 is deposited full plate over the entire structure, that is, it is deposited on the upper surface of layer 25. Layer 27 has a substantially constant thickness C across its entire surface.

Thickness C of third layer 27 is in the range from 1 µm to 4 µm, preferably equal to approximately 2 µm. Thickness C is more preferably equal to 2 µm.

According to an embodiment, third layer 27 is made of USG (Undoped Silicate Glass) and is formed by plasma-enhanced chemical vapor deposition (PECVD). The deposition is for example followed by an anneal of the USG at a temperature in the order of approximately 900 degrees Celsius.

According to another embodiment, third layer 27 is TEOS (tetraethyl orthosilicate) and is formed by LPCVD. The deposition is for example followed by an anneal of the TEOS at a temperature in the order of approximately 900 degrees Celsius. The stack 23 is obtained after layer 27 deposition.

Figure 8:
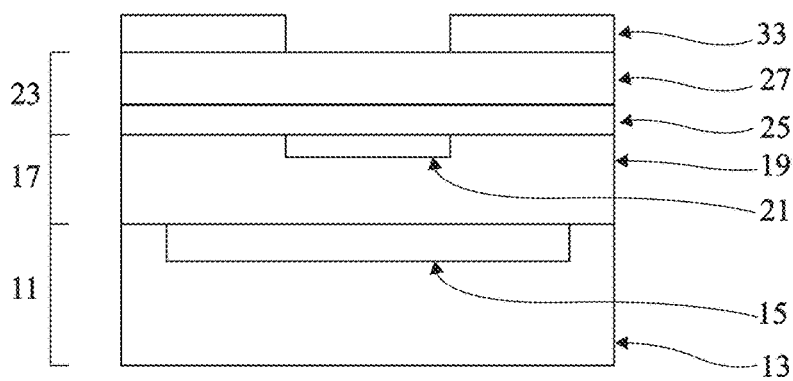
FIG. 8 shows another step of an implementation mode of a method of manufacturing the device of FIG. 1.

FIG. 8 shows another step of an implementation mode of a method of manufacturing the device of FIG. 1.

More particularly, FIG. 8 illustrates a step of deposition and photolithography of a fourth layer 33 of a resin on the front side of the structure obtained at the end of the steps of FIGS. 2 to 7.

In the present embodiment, third layer 27 is covered with fourth layer 33. Fourth layer 33 is deposited, for example, by spin coating to cover third layer 27.

Layer 33 is then submitted to a photolithography, that is, layer 33 is exposed to UV rays through a mask and is then developed in a solvent.

The resin for example is a positive resin, that is, the portion of the resin exposed to UV rays becomes soluble in a solvent.

Layer 33 extends, at the end of the photolithography step, over the entire layer 27 and over a portion of second area 21 and leaving a portion of area 21 non-covered by layer 33.

Figure 9:
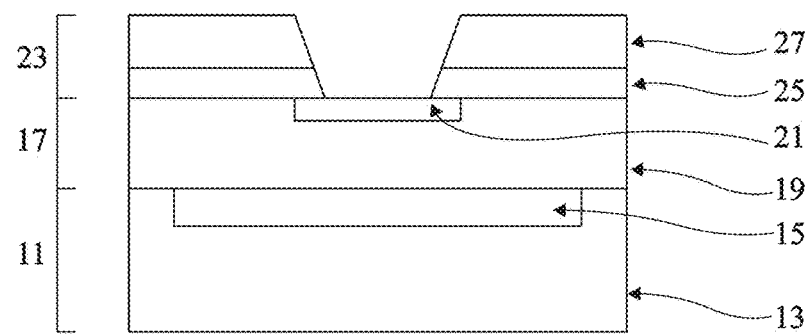
FIG. 9 shows another step of an implementation mode of a method of manufacturing the device of FIG. 1.

FIG. 9 shows another step of an implementation mode of a method of manufacturing the device of FIG. 1.

More particularly, FIG. 9 illustrates a step of etching second layer 25 and third layer 27 from the structure obtained at the end of the steps of FIGS. 2 to 8.

The portions of layers 25 and 27 which are not topped with layer 33 are removed by etching.

The etching of layers 25 and 27 enables to form a through opening in the two layers 25 and 27 and thus to expose a portion of second area 21.

According to the embodiment illustrated in FIG. 9, the etching is performed so that the sides of the opening are oblique and that the opening narrows as it deepens. In other words, at the end of the step illustrated in FIG. 9, the opening is narrower on the front side of area 21 than on the front side of layer 27.

During this step, layer 33 is removed. At the end of the step illustrated in FIG. 9, the structure thus no longer comprises layer 33.

Figure 10:
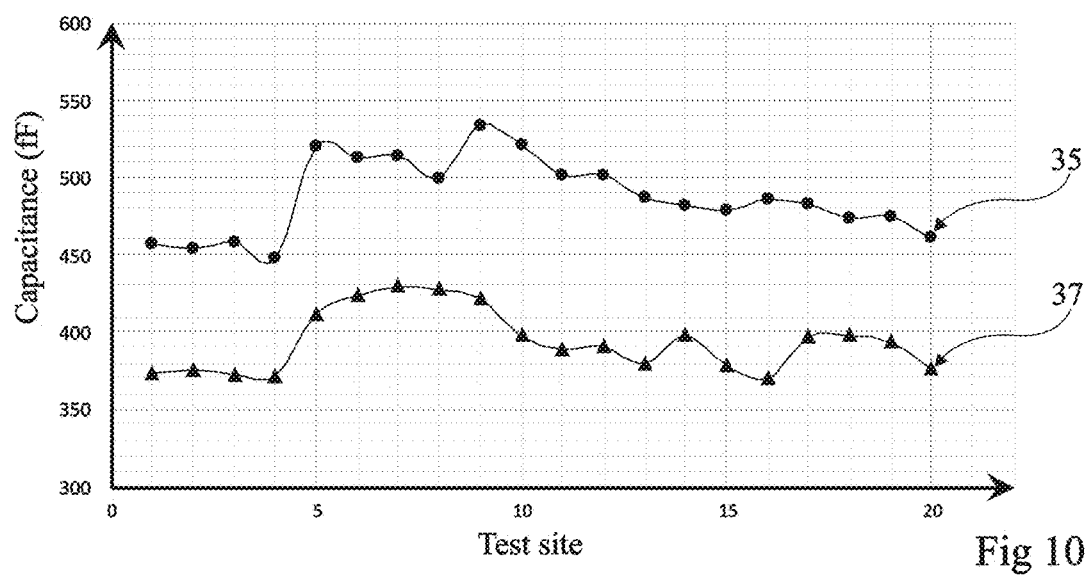
FIG. 10 is a graphical representation illustrating an example of the variation of stray capacitances present in the device illustrated in FIG. 1.

FIG. 10 is a graphical representation illustrating an example of the variation of stray capacitances present in the device illustrated in FIG. 1.

More particularly, FIG. 10 illustrates the variation of the stray capacitances in femtoFarads (fF) according to the test sites and to the composition of stack 23. The measurements have been performed on twenty different test sites, that is, the measurements have been performed on twenty different devices (1, FIG. 1).

The graph of FIG. 10 comprises two curves:
a first curve 35 showing the variation of the stray capacitances, stack 23 being formed of a single TEOS layer; and
a second curve 37 showing the variation of the stray capacitances, stack 23 being formed of a SIPOS layer and of a USG layer.

The curves show that the presence of the SIPOS layer in stack 23 enables to decrease the stray capacitances by in the order of 20% with respect to the case where there is no SIPOS layer in stack 23. In the presence of a single SIPOS-free TEOS layer, the stray capacitances are measured between 440 fF and 540 fF depending on the measurement sites, with an average of 486 fF. In the presence of a SIPOS layer 25 and of a USG field oxide layer, the stray capacitances are measured between 360 fF and 430 fF depending on the test sites, with an average of 394 fF.

Figure 11:
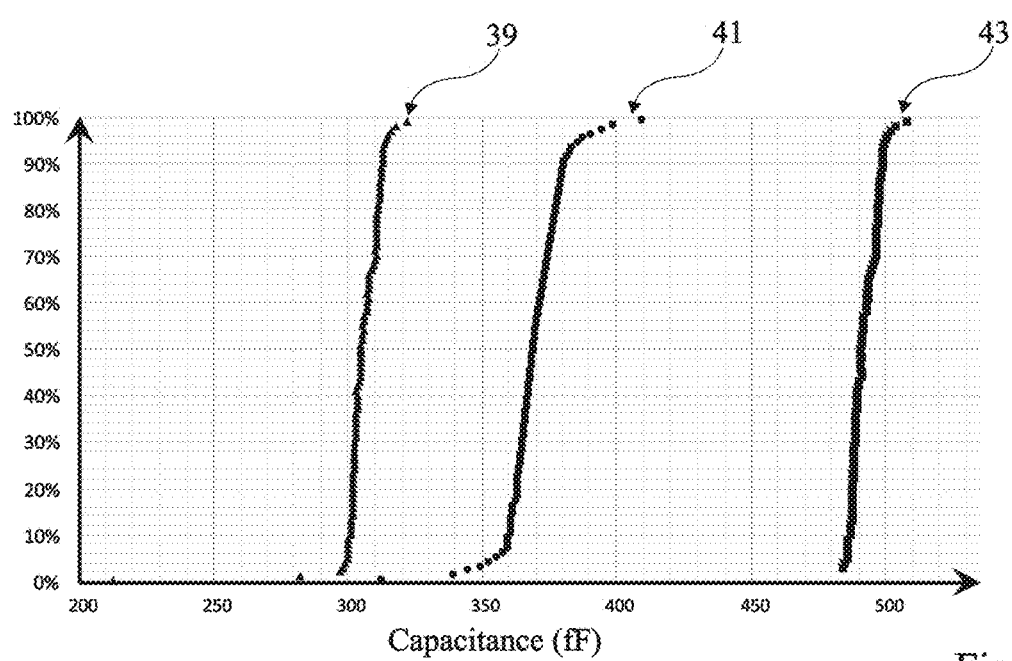
FIG. 11 is a graphical representation illustrating another example of the variation of stray capacitances present in the device illustrated in FIG. 1.

FIG. 11 is a graphical representation illustrating another example of the variation of stray capacitances present in the device illustrated in FIG. 1.

More particularly, FIG. 11 illustrates the variation of the stray capacitances distribution in femtoFarads (fF) according to the composition of stack 23.

The graph of FIG. 11 comprises three curves:
a third curve 39 showing the variation of the stray capacitances, stack 23 being formed of a SIPOS layer topped with a USG layer;
a fourth curve 41 showing the variation of the stray capacitances, stack 23 being formed of a SIPOS layer and of a TEOS layer; and
a fifth curve 43 showing the variation of the stray capacitances, stack 23 being formed of a thermal oxide layer comprising no SIPOS and a TEOS layer.

These curve 39, 41 and 43 show that the stray capacitances of the device, are smaller when stack 23 comprises a SIPOS layer. The stray capacitances are further smaller than when the SIPOS layer is covered with a USG layer as compared with a TEOS layer.

An advantage of the described embodiments is that they enable to increase the field oxide thickness without modifying the doping of underlying epitaxial layer 19.

Another advantage of the described embodiments is that they enable to decrease the metallization stray capacitances, to decrease the line capacitance, and thus to limit data losses when the device is used in a computer or any other electronic product.

Various embodiments and variations have been described. It will be understood by those skilled in the art that certain features of these various embodiments and variations may be combined, and other variations will occur to those skilled in the art. The described embodiments are for example not limited to the examples of dimensions and of materials mentioned hereabove.

Finally, the practical implementation of the described embodiments and variations is within the abilities of those skilled in the art based on the functional indications given hereabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a first stack, forming a Zener diode, including a substrate of a first conductivity type having a first region of a second conductivity type in the substrate, the first region having a surface that is flush with a surface of the substrate;
a second stack, forming a diode, located on and in contact with the surface of the substrate and including a first layer of the second conductivity type having a second region of the first conductivity type in the first layer, the second region having a surface that is flush with a surface of the first layer and is opposite the first stack; and
a third stack including at least a second layer made of semi-insulating polycrystalline silicon, on in contact with the second stack.

2. The device of claim 1, wherein the third stack includes a third layer of a field oxide on in contact with the second layer.

3. The device of claim 2, wherein the third layer is made of undoped silicate glass.

4. The device of claim 2, wherein the third layer is made of tetraethyl orthosilicate.

5. The device of claim 2, wherein the third layer has a thickness in a range from 1 μm to 4 μm.

6. The device of claim 2, wherein the third layer has a thickness of approximately 2 μm.

7. The device of claim 1, wherein the second layer has a thickness in a range from 0.3 μm to 1 μm.

8. The device of claim 1, wherein the second layer has a thickness of approximately 0.8 μm.

9. The device of claim 1, wherein the first layer has a thickness in a range from 8 μm to 15 μm.

10. The device of claim 1, wherein the first layer has a thickness of approximately 12 μm.

11. A method, comprising:
forming first stack including a Zender diode by:
forming a first region in a substrate, the substrate having a first conductivity type, the first region having a second conductivity type that is different from the first conductivity type, the first region having a surface that is flush with a surface of the substrate; and
forming a second stack including a diode by:
forming a first layer by epitaxy, on in contact with the surface of the substrate, the first layer having the second conductivity type; and
forming a second region in the first layer, the second region having the first conductivity type, a surface of the second region being flush with a surface of the first layer; and
forming a third stack including at least a second layer of semi-insulating polycrystalline silicon on in contact with the surface of the first layer.

12. The method of claim 11, wherein forming the third stack includes forming the second layer by low pressure chemical vapor deposition.

13. The method of claim 11, further comprising forming a third layer of a field oxide on and in contact with the second layer.

14. The method of claim 13, wherein forming the third layer includes forming the third layer by plasma-enhanced chemical vapor deposition.

15. The method of claim 13, further comprising simultaneously etching the second layer and the third layer vertically in line with the second area.

16. A device, comprising:
a substrate having a first conductivity type, the substrate having a first surface;
a Zener diode, including a first region of a second conductivity type, the first region extending into the substrate from the first surface of the substrate;
a diode on the Zener diode, the diode including:
a cathode layer of the second conductivity type on and in contact with the first surface of the substrate, the cathode layer having a second surface opposite the first surface of the substrate; and
an anode layer of the first conductivity type extending into the cathode layer from the second surface of the cathode layer; and
a semi-insulating polycrystalline silicon layer on and in contact with the cathode layer and the anode layer of the diode.

17. The device of claim 16, further comprising a third layer of a field oxide on in contact with the semi-insulating polycrystalline silicon layer.

18. The device of claim 17, wherein the third layer is made of undoped silicate glass.

19. The device of claim 17, wherein the third layer is made of tetraethyl orthosilicate.

20. The device of claim 16, further comprising an input/output pad connected to the anode layer.

* * * * *